(12) United States Patent
Hirota et al.

(10) Patent No.: US 10,085,344 B2
(45) Date of Patent: Sep. 25, 2018

(54) ELECTRONIC COMPONENT AND ELECTRONIC COMPONENT BUILT-IN BOARD

(71) Applicant: Murata Manufacturing Co., Ltd., Nagaokakyo-shi, Kyoto-fu (JP)

(72) Inventors: Masaki Hirota, Nagaokakyo (JP); Yoshikazu Sasaoka, Nagaokakyo (JP); Yasunori Taseda, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 9 days.

(21) Appl. No.: 15/473,670

(22) Filed: Mar. 30, 2017

(65) Prior Publication Data

US 2017/0290163 A1 Oct. 5, 2017

(30) Foreign Application Priority Data

Mar. 31, 2016 (JP) .................................. 2016-070343

(51) Int. Cl.
*H01G 4/06* (2006.01)
*H05K 1/18* (2006.01)
(Continued)

(52) U.S. Cl.
CPC ............... *H05K 1/185* (2013.01); *H01C 1/14* (2013.01); *H01C 7/008* (2013.01); *H01G 4/012* (2013.01);
(Continued)

(58) Field of Classification Search
CPC .. H01C 1/14; H01C 7/00; H01C 7/008; H01F 17/00; H01F 27/245; H01F 27/29; H01G 4/12; H01G 4/012; H01G 4/1227; H01G 4/1236; H01G 4/248; H01G 4/30; H01G 27/292; H01L 41/047; H01L 41/053; H01L 41/187; H01L 41/0472; H01L 41/0477; H01L 41/1876; H05K 1/03; H05K 1/11; H05K 1/18; H05K 1/0313; H05K 1/115; H05K 1/185; H05K 3/4697;
(Continued)

(56) References Cited

U.S. PATENT DOCUMENTS

2004/0097017 A1\* 5/2004 Shimanuki .......... H01L 21/4832
438/124
2011/0102971 A1\* 5/2011 Itamura .................... H01G 4/12
361/321.2
(Continued)

FOREIGN PATENT DOCUMENTS

JP 6-326472 A 11/1994
JP 2007-194312 A 8/2007
(Continued)

*Primary Examiner* — Timothy Thompson
*Assistant Examiner* — Guillermo Egoavil
(74) *Attorney, Agent, or Firm* — Keating & Bennett, LLP

(57) ABSTRACT

An electronic component includes an inner electrode inside of a main body and exposed at a surface of the main body, and an outer electrode on a surface of the main body and electrically connected to the inner electrode, wherein a plurality of recesses are provided in a surface of the outer electrode, and each of the plurality of recesses includes a portion in which a diameter of an opening of the recess gradually decreases toward an opening side of the recess.

20 Claims, 4 Drawing Sheets

(51) Int. Cl.
*H01G 4/012* (2006.01)
*H01G 4/248* (2006.01)
*H01G 4/30* (2006.01)
*H01L 41/187* (2006.01)
*H01L 41/047* (2006.01)
*H01L 41/053* (2006.01)
*H01G 4/12* (2006.01)
*H01C 7/00* (2006.01)
*H01C 1/14* (2006.01)
*H05K 3/46* (2006.01)
*H01F 17/00* (2006.01)
*H01F 27/29* (2006.01)

(52) U.S. Cl.
CPC ......... *H01G 4/1227* (2013.01); *H01G 4/1236* (2013.01); *H01G 4/248* (2013.01); *H01G 4/30* (2013.01); *H01L 41/0472* (2013.01); *H01L 41/0477* (2013.01); *H01L 41/053* (2013.01); *H01L 41/1876* (2013.01); *H05K 3/4697* (2013.01); *H01F 17/00* (2013.01); *H01F 27/292* (2013.01); *H05K 2201/1003* (2013.01); *H05K 2201/10015* (2013.01); *H05K 2201/10636* (2013.01); *Y02P 70/611* (2015.11)

(58) Field of Classification Search
CPC .......... H05K 2201/10015; H05K 2201/10022; H05K 2201/1003; H05K 2201/10636; Y02P 70/611
USPC .......................................................... 174/260
See application file for complete search history.

(56) References Cited

U.S. PATENT DOCUMENTS

| | | |
|---|---|---|
| 2014/0182907 A1 | 7/2014 | Lee et al. |
| 2014/0182911 A1* | 7/2014 | Lee ........................ H05K 1/185 174/260 |
| 2014/0262463 A1 | 9/2014 | Lee et al. |
| 2015/0053472 A1* | 2/2015 | Lee ........................ H05K 1/185 174/260 |
| 2015/0109718 A1* | 4/2015 | Choi ........................ H01G 2/06 361/304 |

FOREIGN PATENT DOCUMENTS

| | | |
|---|---|---|
| JP | 4159431 B2 | 10/2008 |
| JP | 2014-130987 A | 7/2014 |
| JP | 2014-239139 A | 12/2014 |
| KR | 10-2014-0112884 A | 9/2014 |

* cited by examiner

ELECTRONIC COMPONENT AND ELECTRONIC COMPONENT BUILT-IN BOARD

CROSS REFERENCE TO RELATED APPLICATIONS

This application claims the benefit of priority to Japanese Patent Application No. 2016-070343 filed on Mar. 31, 2016. The entire contents of this application are hereby incorporated herein by reference.

BACKGROUND OF THE INVENTION

1. Field of the Invention

The present invention relates to electronic components and electronic component built-in boards.

2. Description of the Related Art

In recent years, information terminal apparatuses such as cellular phones, portable audio players, and the like have made progress so as to be small-sized and thin. Along with this trend, boards mounted in electronic apparatuses, electronic components such as capacitors and the like mounted on the boards, and so on have also made progress so as to be small-sized and thin. In order to make the boards be small-sized and thin, it has been attempted to incorporate electronic components in the boards (for example, see Japanese Unexamined Patent Application Publication No. 6-326472). Japanese Unexamined Patent Application Publication No. 6-326472 discloses a board incorporating a chip capacitor therein; that is, inside the board, an electronic component (chip capacitor) is incorporated in a multilayer printed circuit substrate including a resin such as a glass epoxy resin or the like.

In the case where, on an electronic component built-in board in which an electronic component is incorporated, a device such as an IC or the like is mounted by reflow processing or the like, like in the case of the board disclosed in Japanese Unexamined Patent Application Publication No. 6-326472, the electronic component built-in board is exposed at a high temperature atmosphere in some case. In general, since a coefficient of thermal expansion of the electronic component and a coefficient of an interlayer insulation layer are different, there is a case in which the electronic component and the interlayer insulation layer are separated from each other when the temperature of the electronic component built-in board becomes high.

SUMMARY OF THE INVENTION

Preferred embodiments of the present invention provide electronic components that are unlikely to be separated from an interlayer insulation layer when the electronic components are incorporated in multilayer printed circuit substrates.

An electronic component according to a preferred embodiment of the present invention includes an electronic component main body, an inner electrode, and an outer electrode. The electronic component main body includes first and second principal surfaces, first and second side surfaces, and first and second end surfaces. The first and second principal surfaces extend along a lengthwise direction and a width direction perpendicular or substantially perpendicular to the lengthwise direction. The first and second side surfaces extend along the lengthwise direction and a lamination direction perpendicular or substantially perpendicular to the lengthwise direction as well as to the width direction. The first and second end surfaces extend along the width direction and the lamination direction. The inner electrode is disposed inside the electronic component main body. The inner electrode is exposed at a surface of the electronic component main body. The outer electrode is provided on the surface of the electronic component main body. The outer electrode is electrically connected to the inner electrode. A plurality of recesses are provided in a surface of the outer electrode. Each of the plurality of recesses includes a portion in which a diameter of an opening of the recess gradually decreases toward an opening side of the recess.

In an electronic component according to a preferred embodiment of the present invention, the plurality of recesses are provided in the surface of the outer electrode, and each of the plurality of recesses includes the portion in which the diameter of the opening of the recess gradually decreases toward the opening side of the recess. With this, for example, in the case where the electronic component is incorporated in a multilayer printed circuit substrate, a resin included in a resin layer of the multilayer printed circuit substrate is located in the recesses. As such, even if the electronic component built-in board is exposed at a high temperature atmosphere, the electronic component and the resin layer are unlikely to be separated from each other due to an anchor effect.

In an electronic component according to a preferred embodiment of the present invention, it is preferable that an outermost layer of the outer electrode contains Cu, and the recesses be provided in the outermost layer.

In an electronic component according to a preferred embodiment of the present invention, it is preferable for the outermost layer to include a plating film.

In an electronic component according to a preferred embodiment of the present invention, in a cross section extending along the lengthwise direction and the lamination direction at the center or approximate center in the width direction of the electronic component, L1 is defined as a length along the lengthwise direction of the outer electrode; L2 is defined as a shortest length along the lengthwise direction of the portion of the recess in which the diameter of the opening of the recess gradually decreases toward the opening side of the recess; SUM (L2) is defined as the total of L2 lengths of the plurality of recesses; and it is preferable that SUM (L2)/L1 be no less than about 5% and no more than about 22%, for example.

In an electronic component according to a preferred embodiment of the present invention, it is preferable that the outer electrode be provided on the first principal surface, and the SUM (L2)/L1 be no less than about 5% and no more than about 22% in a portion where the outer electrode is provided on the first principal surface, for example.

An electronic component built-in board according to a preferred embodiment of the present invention includes an electronic component according to one of the preferred embodiments of the present invention and a multilayer printed circuit substrate. The electric component is incorporated in the multilayer printed circuit substrate. The multilayer printed circuit substrate includes a resin. The resin is located in the recesses of the electronic component.

In an electronic component built-in board according to a preferred embodiment of the present invention, the resin is located in the recesses of the electronic component. Because of this, the resin is unlikely to be pulled out from the recesses due to the anchor effect even if the electronic component built-in board is exposed at a high temperature atmosphere. Accordingly, the electronic component and the resin layer are unlikely to be separated from each other.

According to the preferred embodiments of the present invention, it is possible to provide an electronic component that is unlikely to be separated from an interlayer insulation layer in the case where the electronic component is incorporated in a multilayer printed circuit substrate.

The above and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
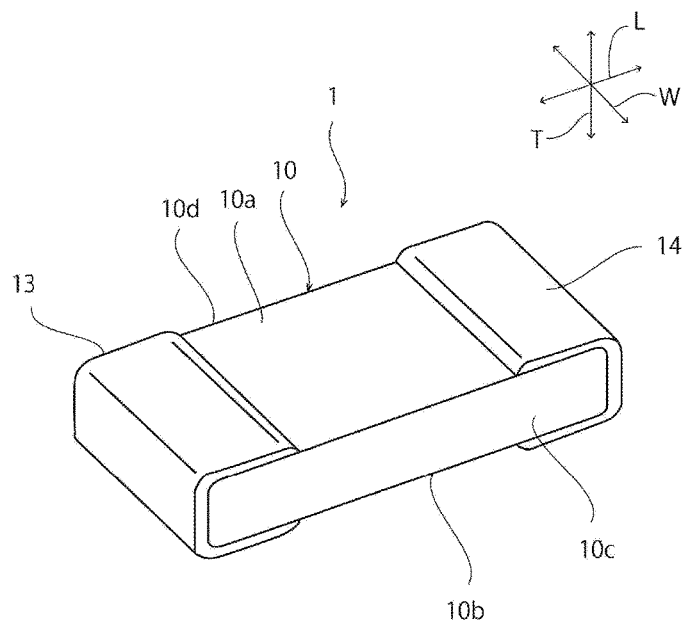
FIG. 1 is a schematic perspective view of an electronic component according to a first preferred embodiment of the present invention.

Hereinafter, examples of preferred embodiments of the present invention is implemented will be described. It is to be noted that the following preferred embodiments are merely examples. The present invention is not limited to the following preferred embodiments in any manner.

In the drawings referred to in the preferred embodiments or the like, constituent elements substantially having the same functions will be referred to with identical reference numerals. Further, the drawings referred to in the preferred embodiments or the like are schematically illustrated. As such, the ratios of dimensions and the like of objects depicted in the drawings differ from the actual ratios of dimensions and the like of those objects in some cases. The ratios of dimensions and the like of the objects differ from drawing to drawing as well in some cases. The specific ratios of dimensions and the like of objects should be understood in consideration of the following descriptions.

First Preferred Embodiment

Figure 2:
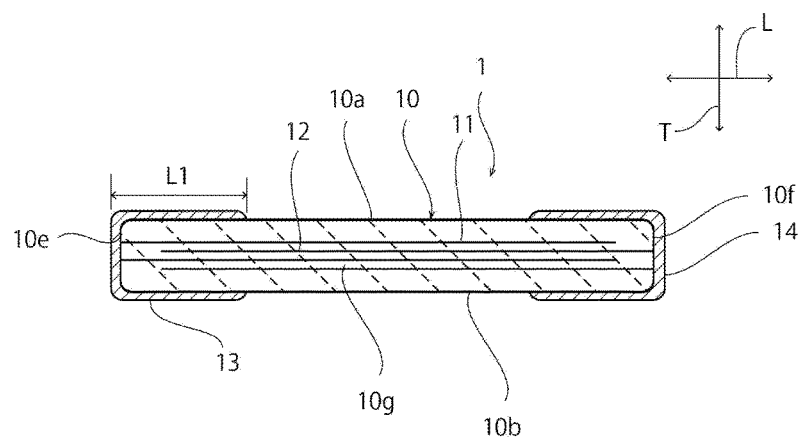
FIG. 2 is a schematic cross-sectional view of the electronic component according to the first preferred embodiment of the present invention.

In a first preferred embodiment of the present invention, an example in which an electronic component 1 shown in FIGS. 1 and 2 is a multilayer ceramic capacitor will be described. Note that, however, the electronic component according to the present preferred embodiment of the present invention is not limited to a capacitor. The electronic component according to the present preferred embodiment of the present invention may be, for example, a piezoelectric component, a thermistor, an inductor, or the like.

As shown in FIGS. 1 and 2, the electronic component 1 includes an electronic component main body 10. In the present preferred embodiment, since the electronic component 1 is a multilayer ceramic capacitor, the electronic component main body 10 may be made with, for example, a dielectric ceramic material. As a specific example of the dielectric ceramic material, $BaTiO_3$, $CaTiO_3$, $SrTiO_3$, $CaZrO_3$, or the like may be cited, for example. An accessory ingredient such as a Mn compound, Mg compound, Si compound, Fe compound, Cr compound, Co compound, Ni compound, rare earth compound, or the like, for example, may be appropriately added to the electronic component main body 10 in accordance with the desired characteristics of the electronic component 1 while taking the above-mentioned ceramic material as a main ingredient.

In the case where the electronic component according to the present preferred embodiment of the present invention is a piezoelectric component, the electronic component main body may be made with piezoelectric ceramics. As a specific example of the piezoelectric ceramics, PZT (lead zirconate titanate) based ceramics or the like may be cited, for example.

In the case where an electronic component according to a preferred embodiment of the present invention is a thermistor, the electronic component main body may be made with semiconductor ceramics. As a specific example of the semiconductor ceramics, spinel-based ceramics or the like may be cited, for example.

In the case where an electronic component according to a preferred embodiment of the present invention is an inductor, the electronic component main body may be made with magnetic ceramics. As a specific example of the magnetic ceramics, ferrite ceramics or the like may be cited, for example.

As shown in FIG. 1, in a present preferred embodiment, the electronic component main body 10 is provided to include a rectangular or substantially rectangular parallelepiped shape. Here, the "rectangular parallelepiped shape" includes a rectangular or substantially rectangular parallelepiped shape of which corners and ridge lines are rounded.

The electronic component main body 10 includes first and second principal surfaces 10a and 10b, first and second side surfaces 10c and 10d, and first and second end surfaces 10e and 10f (see FIG. 2). The first and second principal surfaces 10a and 10b respectively extend along a lengthwise direction L and a width direction W. The width direction W is perpendicular or substantially perpendicular to the lengthwise direction L. The first and second side surfaces 10c and 10d respectively extend along the lengthwise direction L and a thickness direction T. The thickness direction T is perpendicular or substantially perpendicular to the width direction W as well as to the lengthwise direction L. The first and second end surfaces 10e and 10f respectively extend along the width direction W and the thickness direction T.

In the case where a thickness dimension of the electronic component main body 10 is taken as DT, a lengthwise dimension thereof is taken as DL, and a width dimension thereof is taken as DW, it is preferable that DT<DW<DL, (about ½) DW≤DT≤(about ⅓) DW, or DT<about 0.25 mm be satisfied. To be specific, it is preferable that about 0.05 mm≤DT<about 0.3 mm, about 0.4 mm≤DL≤about 1 mm, and about 0.3 mm≤DW≤about 0.5 mm be satisfied, for example. It is more preferable that about 0.08 mm≤DT<about 0.25 mm, about 0.8 mm≤DL≤about 1.1 mm, and about 0.4 mm≤DW≤about 0.5 mm be satisfied, for example.

As shown in FIG. 2, the electronic component 1 includes inner electrodes 11 and 12 disposed inside the electronic component main body 10 and exposed at a surface of the electronic component main body 10. In other words, the inner electrodes 11 and 12 are extended to the surface of the electronic component main body 10.

In this preferred embodiment, although an example in which the electronic component 1 includes two inner electrode types, that is, the inner electrodes 11 and 12, will be described, the present invention is not limited thereto. An electronic component according to a preferred embodiment of the present invention may include only one inner electrode type or include only a single inner electrode, for example.

Specifically, a plurality of first inner electrodes 11 and a plurality of second inner electrodes 12, each including a rectangular or substantially rectangular shape, are disposed inside the electronic component main body 10. The first and second inner electrodes 11, 12 respectively extend along the lengthwise direction L and the width direction W. The first inner electrodes 11 are extended to the first end surface 10e, and are not exposed at any of the second end surface 10f and the first and second side surfaces 10c, 10d. Meanwhile, the second inner electrodes 12 are extended to the second end surface 10f, and are not exposed at any of the first end surface 10e and the first and second side surfaces 10c, 10d. The first inner electrodes 11 and the second inner electrodes 12 are alternately provided along the thickness direction T being distanced from each other. A thickness of a ceramic section 10g provided between the first inner electrode 11 and the second inner electrode 12 may be set, for example, to be no less than about 0.5 μm and no more than about 10 μm. Each thickness of the first and second inner electrodes 11 and 12 may be set, for example, to be no less than about 0.2 μm and no more than about 2 μm.

The first and second inner electrodes 11 and 12 may each include an appropriate conductive material. The first and second inner electrodes 11 and 12 may each include a metal such as Ni, Cu, Ag, Pd, or Au, for example, or with an alloy containing one metal type selected from these metals such as an Ag—Pd alloy, for example.

A glass layer may be located on each exposed portion of the inner electrodes in the end surfaces 10e and 10f. By providing the glass layer on the exposed portion of the inner electrodes 11 and 12, moisture resistance and plating resistance is secured even if fineness of outer electrodes 13 and 14 is low, and a situation where moisture enters into the electronic component main body 10 from the exterior is significantly reduced or prevented so that the moisture resistance and plating resistance is enhanced.

As shown in FIGS. 1 and 2, the electronic component 1 includes the outer electrodes provided on the surface of the electronic component main body 10 and electrically connected to the inner electrodes. To be specific, the electronic component 1 includes the first outer electrode 13 electrically connected to the first inner electrode 11, and the second outer electrode 14 electrically connected to the second inner electrode 12. However, in a preferred embodiment of the present invention, an electronic component may include only a single outer electrode.

Specifically, the first outer electrode 13 is connected to the first inner electrodes 11 on the first end surface 10e. It is preferable for the first outer electrode 13 to be provided at least on the first principal surface 10a. In this preferred embodiment, the first outer electrode 13 extends from the first end surface 10e over to the first and second principal surfaces 10a, 10b.

The second outer electrode 14 is connected to the second inner electrodes 12 on the second end surface 10f. It is preferable for the second outer electrode 14 to be provided at least on the first principal surface 10a. In this preferred embodiment, the second outer electrode 14 extends from the second end surface 10f over to the first and second principal surfaces 10a, 10b.

It is preferable that a metal of the first inner electrode 11 diffuse into the first outer electrode 13. In the case where the metal of the first inner electrode 11 diffuses into the first outer electrode 13, the volume of the first outer electrode 13 is expanded so that tiny spaces are unlikely to be generated inside the first outer electrode 13. As such, sealing performance of the first outer electrode 13 is enhanced. This makes it possible to prevent a situation where moisture or the like enters into the interior of the electronic component main body 10. It is preferable that the thickness of a portion of the first outer electrode 13 into which the metal of the first inner electrode 11 diffuses be equal to or greater than about 4 μm, for example.

It is preferable that a metal of the second inner electrode 12 diffuse into the second outer electrode 14. In the case where the metal of the second inner electrode 12 diffuses into the second outer electrode 14, the volume of the second outer electrode 14 is expanded so that tiny spaces are unlikely to be generated inside the second outer electrode 14. As such, sealing performance of the second outer electrode 14 is enhanced. This makes it possible to prevent a situation where moisture or the like enters into the interior of the electronic component main body 10. It is preferable that the thickness of a portion of the second outer electrode 14 into which the metal of the second inner electrode 12 diffuses be equal to or greater than about 4 μm, for example.

Each of the first and second outer electrodes 13 and 14 may be made with an appropriate conductive material. In the present preferred embodiment, each of the first and second outer electrodes 13 and 14 includes a multilayer body that includes a base electrode layer provided on the electronic component main body 10 and a metal layer provided on the base electrode layer. It is preferable for the metal layer to include a plating layer. In the present preferred embodiment, an example in which the metal layer includes a plating layer will be described.

It is preferable for the base electrode layer to contain metal powder and glass powder. The metal powder of the base electrode layer may include an appropriate metal such as Ni, Cu, Ag, Pd, Au, Ag—Pd alloy, or the like, for example. The base electrode layer may be a layer calcined along with the inner electrodes at the same time, or a layer baked after the inner electrodes having been calcined. The base electrode layer may include a plating layer, or include a conductive resin layer provided by curing a conductive resin containing a thermosetting resin. It is preferable for the thickness of the base electrode layer to be no less than about 1 μm and no more than about 20 μm, for example.

The plating layer includes an outermost layer 15 (see FIG. 3) of each of the outer electrodes 13 and 14. The plating layer may include, for example, Cu, Ni, Ag, Pd, Ag—Pd alloy, Au, or the like. The plating layer may include a multilayer body that is made of a plurality of plating layers. The outermost layer 15 in the plating layer may include one metal type selected from a group of Cu, Au, Ag, and Al, or with an alloy containing the stated metal, for example. In particular, it is preferable for the outermost layer 15 in the plating layer, that is, for the outermost layer 15 of each of the outer electrodes 13 and 14 to include Cu or a Cu alloy. In other words, it is preferable for the outermost layer 15 of each of the outer electrodes 13 and 14 to contain Cu, and it is also preferable for the outermost layer 15 of each of the outer electrodes 13 and 14 to include a plating film made of Cu or a Cu alloy.

It is preferable for the thickness of the plating layer to be no less than about 1 µm and no more than about 10 µm, for example.

For example, in the case where the electronic component 1 is incorporated inside an electronic component built-in board (a board configured to incorporate an electronic component in resin), in order to electrically connect the electronic component 1 and the wiring disposed in the electronic component built-in board, via hole electrodes facing the outer electrodes 13 and 14 are provided in some case. Via holes that define the via hole electrodes may be formed by radiating a laser beam such as a $CO_2$ laser beam or the like against the outer electrodes 13 and 14, for example. Because laser reflectance of a plating film containing Cu is high, including the outermost layer 15 of each of the outer electrodes 13 and 14 with the plating film containing Cu efficiently prevent a situation where the electronic component main body 10 is damaged by the laser beam.

The surface of the plating layer including the outermost layer 15 may be oxidized. Of the plating layer including the outermost layer 15, it is preferable for a surface of a portion thereof defining ridge lines of the outer electrodes 13 and 14 to be oxidized. In this case, the oxidized portion of the plating layer and the oxygen contained in a resin of the electronic component built-in board are coupled, thus making it possible to improve a close contact property between the electronic component 1 and the electronic component built-in board. In order to further improve the close contact property between the electronic component 1 and the electronic component built-in board, it is preferable that an oxidized film be disposed on the overall surface of the plating film including the outermost layer 15.

Although not illustrated, at least a portion of the first and second outer electrodes, that is, for example, a portion of the base electrode layers may be embedded in the interior of the electronic component main body 10. In this case, when a thickness of the center of each of the outer electrodes 13, 14 positioned on the principal surface is taken as t0 and a maximum thickness of the portion of each of the outer electrodes 13, 14 embedded in the interior of the electronic component main body 10 is taken as t1, it is preferable that (about $\frac{1}{10}$) t0≤t1≤(about $\frac{2}{5}$) t0 be satisfied. If t1 is smaller than (about $\frac{1}{10}$) t0, close contact properties between the outer electrodes 13, 14 and the electronic component main body 10 are excessively degraded, whereby the outer electrodes become likely to be separated and the reliability is lowered in some case. In addition, if t1 is smaller than (about $\frac{1}{10}$) t0, the thickness of a not-embedded portion of the outer electrode 13, 14 becomes excessively large, whereby the electronic component 1 may not be made sufficiently thin in some case.

Meanwhile, if t1 is greater than (about $\frac{2}{5}$) t0, the reliability of the electronic component 1 is lowered in some case. More specifically, when the outer electrodes 13, 14 are embedded in the principal surfaces 10a, 10b of the electronic main body 10, a large stress is applied to the inner electrodes 11, 12 so that the inner electrodes 11, 12 are damaged. As a result, there are cases in which desired capacitance may not be obtained, short-circuiting is caused, and so on.

The thickness of the portion of the outer electrodes 13, 14 embedded in the electronic component main body 10 may be obtained as follows: the side surface 10c of the electronic component 1 is polished until the width dimension of the electronic component 1 becomes about half the width dimension before the polishing; and an exposed cross section is observed under an optical microscope or the like so as to measure a distance between the first principal surface 10a and a lower surface of the outer electrodes 13, 14 at the center in the lengthwise direction L of a portion of the outer electrodes 13, 14 positioned on the first principal surface 10a, thus obtaining the above-mentioned thickness.

It is preferable that an end side of an end portion of the portion of the first and second outer electrodes 13, 14 positioned on the first and second principal surfaces 10a, 10b be provided with a linear or substantially linear shape. In this case, when a laser beam is radiated against the outer electrodes 13 and 14, the laser beam is likely to strike the outer electrodes 13, 14 and is unlikely to strike the electronic component main body 10 even if a laser striking position is shifted. This makes it possible to surely establish the electric connection between the via hole electrodes and the outer electrodes 13 and 14, and prevents the electronic component main body 10 from being damaged.

Here, the "linear shape" refers to a shape in which, in the case where a line connecting both ends in the width direction W of each of the outer electrodes 13 and 14 located on the first and second principal surfaces 10a and 10b is taken as a reference line, the center in the width direction W of an edge end of each of the outer electrodes 13 and 14 is positioned within a region defined by the reference line±about 30 µm in the lengthwise direction L, for example.

A manufacturing method for the electronic component 1 is not limited to any specific one. The electronic component 1 may be manufactured in the following manner, for example.

First, a ceramic green sheet to define the electronic component main body 10 is prepared. Subsequently, a conductive paste is applied onto the ceramic green sheet so as to form a conductive paste layer. The application of the conductive paste may be performed by various kinds of printing methods such as a screen printing method, for example. The conductive paste may contain a binder, a solvent, or the like in addition to conductive fine particles.

Next, a plurality of ceramic green sheets without conductive paste layers being formed thereupon, ceramic green sheets on which conductive paste layers each having a shape corresponding to the first or second inner electrode are formed, and another plurality of ceramic green sheets without conductive paste layers being formed thereupon are laminated in that order and pressed in the lamination direction, thus manufacturing a mother multilayer body.

Next, a plurality of raw ceramic multilayer bodies are manufactured from the mother multilayer body by cutting the mother multilayer body along virtual cut lines on the mother multilayer body. The cutting of the mother multilayer body may be performed with a dicing machine, a press-cutter, or the like. Barrel polishing or the like may be performed on the raw ceramic multilayer bodies so as to round ridge lines, corners, and the like.

Subsequently, each of the raw ceramic multilayer bodies is calcined. The first and second inner electrodes are calcined in the calcination process. The calcination temperature may be appropriately set in accordance with respective types of a ceramic material, a conductive paste, and the like to be used. The calcination temperature may be set to be no less than about 900° C. and no more than about 1,300° C., for example.

Next, a conductive paste is applied to both end portions of the ceramic multilayer body after the calcination (electronic component main body) using a dipping method or the like.

The conductive paste contains a vanishing agent such as a resin or the like in addition to conductive fine particles. Subsequently, the conductive paste having been applied to the ceramic multilayer body is dried. Thereafter, the dried conductive paste is baked so as to form a calcination electrode layer. It is preferable for the baking temperature to be no less than about 700° C. and no more than about 900° C., for example.

The conductive paste layer may be formed on a raw electronic component main body in advance, and the calcination electrode layer may be calcined along with the electronic component main body and the inner electrodes at the same time.

Thereafter, one or a plurality of plating layers are formed on the calcination electrode layer, thus making it possible to complete the electronic component 1. Although the plating layer may be formed by an electrolytic plating method or a non-electrolytic plating method, it is more preferable to form the plating layer using the electrolytic plating method. A barrel plating method may be used as the plating method.

The outer electrodes 13 and 14 may include only one or a plurality of plating layers without providing the base electrode layer.

Figure 4:
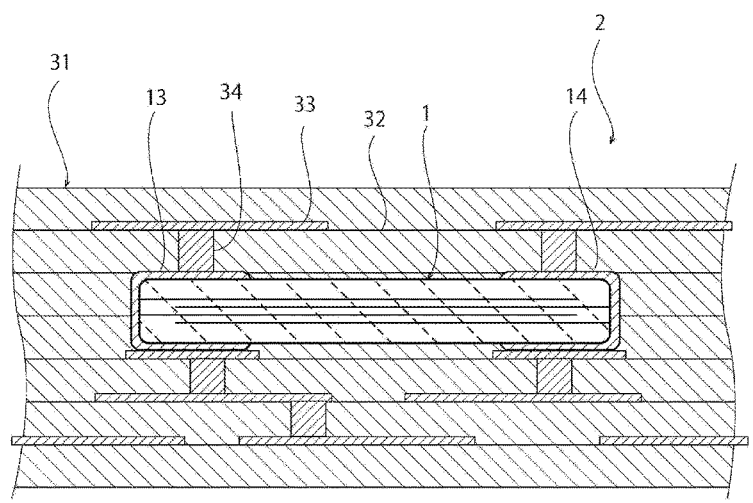
FIG. 4 is a schematic cross-sectional view of an electronic component built-in board according to the first preferred embodiment of the present invention.

FIG. 4 is a schematic cross-sectional view of an electronic component built-in board 2 according to the present preferred embodiment.

As shown in FIG. 4, the electronic component built-in board 2 includes a multilayer printed circuit substrate 31 including a resin inside thereof and the electronic component 1. To be specific, the electronic component built-in board 2 includes resin layers 32 each including a resin or resin composition material (for example, glass epoxy), wiring 33 provided between the resin layers 32 adjacent to each other in the lamination direction, and via hole electrodes 34 to connect the wiring 33 to each other and also connecting portions of the wiring 33 to the outer electrodes 13, 14. The electronic component 1 is incorporated inside the multilayer printed circuit substrate 31, and is connected to the wiring 33 through the via hole electrodes 34.

In the electronic component built-in board 2, the resin of the resin layer 32 is located in a recess 15a (see FIG. 3), which will be explained later in detail, located in the outermost layer 15 of the outer electrodes 13 and 14 of the electronic component 1.

In the case where, on an electronic component built-in board in which an electronic component is incorporated inside a multilayer printed circuit substrate, a device such as an IC (Integrated Circuit) or the like is mounted by reflow processing or the like, for example, the electronic component built-in board is exposed at a high temperature atmosphere in some case. In addition, also in the case where various kinds of processing are performed on the electronic component built-in board, there is a case in which the electronic component built-in board is exposed at a high temperature atmosphere. Because a coefficient of thermal expansion of an electronic component and a coefficient of thermal expansion of a resin layer are different, in the case where the temperature of the electronic component built-in board is changed, stress is applied between the electronic component and the resin layer so that the electronic component and the resin layer are separated from each other in some case in the electronic component built-in board in which the electronic component is incorporated.

Figure 3:
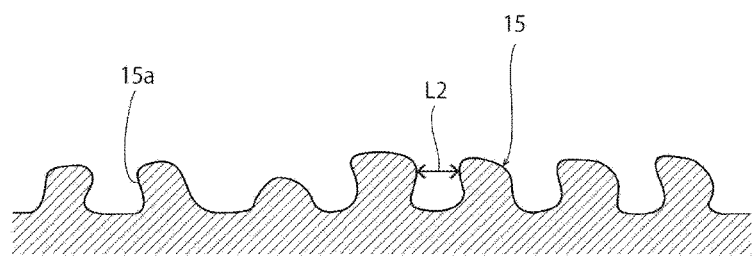
FIG. 3 is a schematic cross-sectional view in which a portion of an outermost layer of an outer electrode is enlarged and illustrated.

As shown in FIG. 3, a plurality of recesses 15a are provided in a surface of each of the outer electrodes 13 and 14 in the electronic component 1. To be specific, the plurality of recesses 15a are provided in the surface of each of the outer electrodes 13 and 14, and each of the plurality of recesses 15a includes a portion in which a diameter of an opening of the recess gradually decreases toward an opening side of the recess. Because of this, in the case where the electronic component 1 is incorporated inside the multilayer printed circuit substrate (see FIG. 4), the resin included in the resin layer 32 is located in the recesses 15a. As such, even if stress is applied between the electronic component and the resin layer due to the electronic component built-in board 2 being exposed at a high temperature atmosphere, the resin is unlikely to be pulled out from the recess 15a due to the anchor effect. Accordingly, the electronic component 1 and the resin layer 32 are unlikely to be separated from each other.

A method for forming, in the surface of the outer electrodes 13 and 14, the recesses 15a, each of which includes a portion in which the diameter of an opening of the recess gradually decreases toward the opening side of the recess, is not limited to any specific one. The recess 15a may be formed by causing the outer electrodes 13 and 14 to make contact with an organic acid-based processing solvent, for example.

In the present preferred embodiment, the outermost layer of the outer electrodes 13 and 14 contains Cu. With this, when a laser beam is radiated against the outer electrodes 13 and 14 so as to form the via holes that define the via hole electrodes to be connected to the outer electrodes 13 and 14, for example, the laser beam is reflected by the outer electrodes 13 and 14 at high reflectance. This effectively prevents a situation where the electronic component main body 10 is damaged by the laser beam.

In order to more effectively prevent the separation between the electronic component 1 and the resin layer 32, in the case where, in a cross section extending along the lengthwise direction L and the lamination direction T at the center or approximate center in the width direction W of the electronic component 1, a length along the lengthwise direction L of the outer electrodes 13 and 14 is taken as L1; a shortest length along the lengthwise direction L of a portion of the recess 15a in which the diameter of an opening of the recess gradually decreases toward the opening side of the recess is taken as L2; and the total of L2 lengths of the plurality of recesses 15a is taken as SUM (L2), it is preferable for SUM (L2)/L1 to be no less than about 5% and no more than about 22%, for example. To be specific, it is preferable that the outer electrodes 13 and 14 be provided on the first principal surface 10a, and SUM (L2)/L1 be no less than about 5% and no more than about 22%, for example, in a section where the outer electrodes 13 and 14 are provided on the first principal surface 10a. In this case, because a large number of recesses 15a for activating the anchor effect are present, the separation between the electronic component 1 and the resin layer 32 is more effectively prevented. However, in the case where an excessively large number of recesses 15a are present, strength of the outermost layer of the outer electrodes 13 and 14 is reduced so that the outermost layer is broken, whereby the electronic component 1 and the resin layer 32 become likely to be separated from each other in some case. As such, it is preferable that the amount of the recesses 15a fall within the above-discussed range.

Hereinafter, another example of a preferred embodiment of the present invention will be described. Note that in the following description, constituent elements substantially having the same functions as those of the first preferred embodiment are referred to with identical reference numerals, and description thereof will be omitted.

Second Preferred Embodiment

Figure 5:
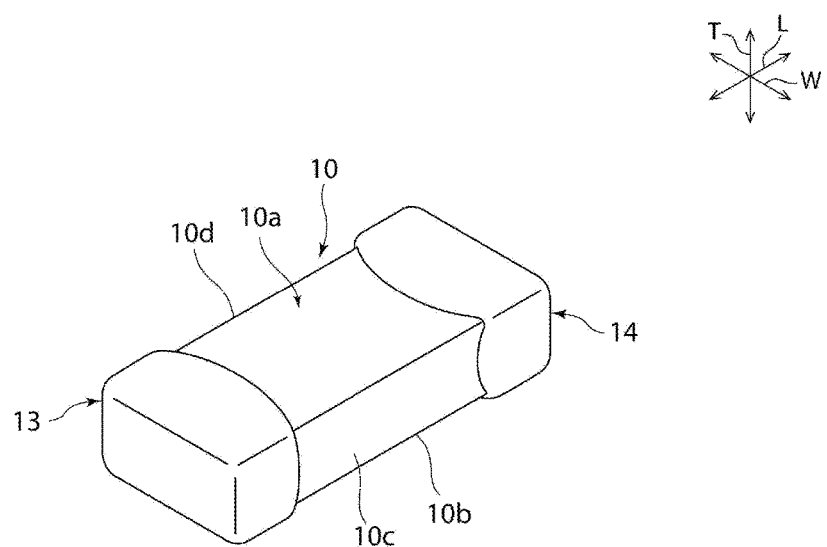
FIG. 5 is a schematic perspective view of an electronic component according to a second preferred embodiment of the present invention.

FIG. 5 is a schematic perspective view of an electronic component according to a second preferred embodiment of the present invention. In the first preferred embodiment, an example in which the first outer electrode 13 extends from the first end surface 10e over to the first and second principal surfaces 10a, 10b, while the second outer electrode 14 extends from the second end surface 10f over to the first and second principal surfaces 10a, 10b is described. However, the present invention is not limited thereto. As shown in FIG. 5, the first outer electrode 13 may additionally be provided on the first and second side surfaces 10c and 10d, and the second outer electrode 14 may additionally be provided on the first and second side surfaces 10c and 10d as well. Also in this case, the separation between the resin layer 32 and the outer electrodes 13, 14 of the electronic component 1 is further prevented.

Hereinafter, various preferred embodiments of the present invention will be described in more detail according to specific working examples. However, the present invention is not limited to the following working examples in any manner, and appropriate modifications may be performed without departing from the scope and spirit of the present invention.

Working Example 1

Multilayer ceramic capacitors were manufactured using, as an example, the manufacturing method discussed in the first preferred embodiment. In Working Example 1, multilayer ceramic capacitors were manufactured while setting a target value of SUM (L2)/L1 to be about 2%, for example.

Specifications of the manufactured multilayer ceramic capacitors are as follows.

Design Dimensions: L×W×T=about 1.0 mm×0.5 mm×0.15 mm
- Ceramic Material: $BaTiO_3$
- Capacitance of Capacitor: about 0.22 μF
- Rated Voltage: about 6.3 V
- Outer Electrode
- Base Electrode:
    - Base Electrode Layer: calcination electrode layer containing Ni
    - Base Electrode Layer Thickness: about 2.5 μm
- Metal Layer:
    - First Metal Layer: Cu plating
    - First Metal Layer Thickness: about 8 μm Next, roughening processing was performed on the manufactured multilayer ceramic capacitors.

First, preprocessing was performed. To be specific, about 1,000 capacitors (samples) stored in a netted basket were immersed in a sulfuric acid of about 3.5 mass %, and the capacitors were agitated in a hydrochloric acid by swinging the netted basket for about 60 seconds. Subsequently, the above-mentioned about 1,000 samples were washed by blowing purified water to the samples using a washing bottle for about 30 seconds, and the capacitors were washed by being further exposed at running purified water for about 60 seconds.

Next, etching processing was performed. To be specific, the above-mentioned about 1,000 samples having been preprocessed in the manner described above were immersed in an organic acid-based roughening processing solvent, and the capacitors were agitated by swinging the netted basket for about 45 seconds (etching time). Subsequently, these about 1,000 samples were washed by blowing purified water to the samples using the washing bottle for about 30 seconds, and the capacitors were washed by being further exposed at the running purified water for about 60 seconds.

Next, washing processing was performed with a hydrochloric acid. To be specific, the above-mentioned about 1,000 samples having experienced the etching processing were immersed in a hydrochloric acid of about 3.5 mass %, and the capacitors were agitated by swinging the netted basket for about 60 seconds. Subsequently, these about 1,000 samples were washed by blowing purified water to the samples using the washing bottle for about 30 seconds, and the capacitors were washed by being further exposed at the running purified water for about 60 seconds.

Next, the above-mentioned about 1,000 samples were dried by being heated at about 60° C. for about 15 minutes.

Working Example 2

Samples were manufactured in the same manner as Working Example 1 except that the etching time for the multilayer ceramic capacitors was set to be about 60 seconds in the etching processing. In Working Example 2, the multilayer ceramic capacitors were manufactured while setting a target value of SUM (L2)/L1 to be about 5%, for example.

Working Example 3

Samples were manufactured in the same manner as Working Example 1 except that the etching time for the multilayer ceramic capacitors was set to be about 90 seconds in the etching processing. In Working Example 3, the multilayer ceramic capacitors were manufactured while setting a target value of SUM (L2)/L1 to be about 10%, for example.

Working Example 4

Samples were manufactured in the same manner as Working Example 1 except that the etching time for the multilayer ceramic capacitors was set to be about 120 seconds in the etching processing. In Working Example 4, the multilayer ceramic capacitors were manufactured while setting a target value of SUM (L2)/L1 to be about 22%, for example.

Working Example 5

Samples were manufactured in the same manner as Working Example 1 except that the etching time for the multilayer ceramic capacitors was set to be about 180 seconds in the etching processing. In Working Example 5, the multilayer ceramic capacitors were manufactured while setting a target value of SUM (L2)/L1 to be about 30%, for example.

Comparative Example 1

Samples were manufactured in the same manner as Working Example 1 except that the roughening processing was not performed on the multilayer ceramic capacitors.

Comparative Example 2

Samples were manufactured in the same manner as Working Example 1 except that the etching time for the multilayer ceramic capacitors was set to be about 30 seconds in the etching processing.

Shapes of the recesses in the outer electrodes of the multilayer ceramic capacitors were evaluated in the respective Working Examples and Comparative Examples.

First, a side surface of each of the multilayer ceramic capacitors was polished until a width dimension of the multilayer ceramic capacitor became about half the width dimension thereof before the polishing so as to expose a cross section. This cross section was observed under an optical microscope; as a result, it was confirmed that a recess including a portion in which the diameter of an opening of the recess became smaller toward an opening side of the recess was located in the surface of the outer electrode in Working Examples 1 to 4. On the other hand, in Comparative Examples 1 and 2, it was not possible to confirm that a recess including a portion in which the diameter of an opening of the recess became smaller toward the opening side of the recess was located in the surface of the outer electrode.

Evaluation of close contact properties between the resin and the multilayer ceramic capacitors manufactured by the above-discussed method was performed.

First, a multilayer ceramic capacitor was disposed on a surface of a glass epoxy substrate. Subsequently, the glass epoxy substrate, on which the multilayer ceramic capacitor was disposed, was laminated with a sheet made of an epoxy resin and heated at no less than about 160° C. and no more than about 200° C., whereby a substrate in which the multilayer ceramic capacitor was incorporated in the resin was manufactured.

Next, the substrate, in which the multilayer ceramic capacitor was incorporated, was preheated for about 24 hours at no less than about 120° C. and no more than about 130° C., and reflow processing was performed on the substrate five times. The maximum temperature of the reflow processing was set to be about 260° C. Subsequently, the substrate was cooled for about 120 seconds.

The substrate having experienced the above-discussed processing was polished in a direction parallel to the width direction of the multilayer ceramic capacitor incorporated in the substrate until the width dimension of the multilayer ceramic capacitor became about half the width dimension thereof before the polishing so as to expose a cross section. This cross-section was observed under a scanning electron microscope (SEM) at an amplification of about 2,000 so as to confirm presence/absence of the separation between the multilayer ceramic capacitor and the resin. Each result is shown in Table 1.

A side surface of each multilayer ceramic capacitor was polished until a width dimension of each five multilayer ceramic capacitors manufactured in the respective Working Examples and Comparative Examples became about (½)·W+100 μm so as to expose a cross section. In the cross section, L1 and L2 of the first outer electrode as well as L1 and L2 of the second outer electrode were measured under the electron microscope so as to calculate SUM (L2)/L1.

Subsequently, the side surface of each multilayer ceramic capacitor was further polished until a width dimension W of the multilayer ceramic capacitors became about (½)·W+50 μm so as to expose a cross section. In the cross section, L1 and L2 of the first outer electrode as well as L1 and L2 of the second outer electrode were measured under the electron microscope so as to measure SUM (L2)/L1 and calculate the average thereof.

Next, the side surface of each multilayer ceramic capacitor was further polished until the width dimension W of the multilayer ceramic capacitors manufactured in the respective Working Examples and Comparative Examples became about (½)·W so as to expose a cross section. In the cross section, L1 and L2 of the first outer electrode as well as L1 and L2 of the second outer electrode were measured under the electron microscope so as to calculate SUM (L2)/L1.

Next, the side surface of each multilayer ceramic capacitor was polished until the width dimension W of the multilayer ceramic capacitors manufactured in the respective Working Examples and Comparative Examples became about (½)·W−50 μm so as to expose a cross section. In the cross section, L1 and L2 of the first outer electrode as well as L1 and L2 of the second outer electrode were measured under the electron microscope so as to calculate SUM (L2)/L1.

Subsequently, the side surface of each multilayer ceramic capacitor was polished until the width dimension W of the multilayer ceramic capacitors manufactured in the respective Working Examples and Comparative Examples became about (½)·W−100 μm so as to expose a cross section. In the cross section, L1 and L2 of the first outer electrode as well as L1 and L2 of the second outer electrode were measured under the electron microscope so as to calculate SUM (L2)/L1.

Referring to the calculated SUM (L2)/L1 values, five multilayer ceramic capacitors having a target SUM (L2)/L1 value were picked out. The results are shown in Table 1.

TABLE 1

| | Roughening Processing Time (Sec.) | SUM (L2)/L1 | Separation-Confirmed Samples/Total Samples |
|---|---|---|---|
| Comparative Example 1 | 0 | 0% | 4/5 |
| Comparative Example 2 | 30 | 0% | 2/5 |
| Working Example 1 | 45 | 2% | 1/5 |
| Working Example 2 | 60 | 5% | 0/5 |
| Working Example 3 | 90 | 10% | 0/5 |
| Working Example 4 | 120 | 22% | 0/5 |
| Working Example 5 | 180 | 30% | 1/5 |

Based on the results shown in Table 1, it was discovered that, in the case where SUM (L2)/L1 was not 0%, that is, in the case where a plurality of recesses each including a portion in which the diameter of an opening of the recess became smaller toward an opening side of the recess were provided in the surface of the outer electrodes, the multilayer ceramic capacitor and the resin were unlikely to be separated from each other. Further, it was discovered that, in the case where SUM (L2)/L1 was no less than about 5% and no more than about 22%, the multilayer ceramic capacitor and the resin were much less likely to be separated from each other.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:
1. An electronic component comprising:
an electronic component main body including first and second principal surfaces that extend along a lengthwise direction and a width direction perpendicular or substantially perpendicular to the lengthwise direction, first and second side surfaces that extend along the lengthwise direction and a lamination direction perpendicular or substantially perpendicular to the lengthwise direction and to the width direction, and first and second end surfaces that extend along the width direction and the lamination direction;
an inner electrode that is disposed inside the electronic component main body and is exposed at the first end surface of the electronic component main body; and
an outer electrode that is provided on the first end surface of the electronic component main body and is electrically connected to the inner electrode; wherein
a plurality of recesses are provided in a surface of the outer electrode, and each of the plurality of recesses includes a portion in which a diameter of an opening of the recess gradually decreases toward an opening side of the recess.

2. The electronic component according to claim 1, wherein an outermost layer of the outer electrode contains Cu, and the recesses are provided in the outermost layer.

3. The electronic component according to claim 2, wherein the outermost layer includes a plating film.

4. The electronic component according to claim 1, wherein
in a cross section extending along the lengthwise direction and the lamination direction at a center or an approximate center in the width direction of the electronic component:
L1 is defined as a length along the lengthwise direction of the outer electrode;
L2 is defined as a shortest length along the lengthwise direction of the portion of the recess in which the diameter of the opening of the recess gradually decreases toward the opening side of the recess;
SUM (L2) is defined as a total of L2 lengths of the plurality of recesses; and
SUM (L2)/L1 is no less than about 5% and no more than about 22%.

5. The electronic component according to claim 4, wherein
the outer electrode is provided on the first principal surface; and
SUM (L2)/L1 is no less than about 5% and no more than about 22% in a portion where the outer electrode is provided on the first principal surface.

6. An electronic component built-in board comprising:
the electronic component according to claim 1; and
a multilayer printed circuit substrate which includes a resin and in which the electric component is included; wherein
the resin is located in the recesses of the electronic component.

7. The electronic component according to claim 1, wherein the outer electrode extends from the first end surface over to the first and second principal surfaces of the electronic component main body.

8. The electronic component according to claim 1, wherein the outer electrode is provided on the first principal surface, the second principal surface, the first side surface, and the second side surface of the electronic component main body.

9. The electronic component according to claim 1, wherein the electronic component is a multilayer ceramic capacitor.

10. The electronic component built-in board according to claim 6, further comprising a via hole electrode or a connection portion of wiring that connects to the outer electrode of the electronic component.

11. An electronic component comprising:
an electronic component main body including first and second principal surfaces that extend along a lengthwise direction and a width direction perpendicular or substantially perpendicular to the lengthwise direction, first and second side surfaces that extend along the lengthwise direction and a lamination direction perpendicular or substantially perpendicular to the lengthwise direction and to the width direction, and first and second end surfaces that extend along the width direction and the lamination direction;
a first inner electrode that is disposed inside the electronic component main body and is exposed at the first end surface of the electronic component main body;
a second inner electrode that is disposed inside the electronic component main body and is exposed at the second end surface of the electronic component main body; and
a first outer electrode that is provided on the first end surface of the electronic component main body and is electrically connected to the first inner electrode;
a second outer electrode that is provided on the second end surface of the electronic component main body and is electrically connected to the second inner electrode; wherein
a plurality of recesses are provided in a surface of each of the first and second outer electrodes, and each of the plurality of recesses includes a portion in which a diameter of an opening of the recess gradually decreases toward an opening side of the recess.

12. The electronic component according to claim 11, wherein an outermost layer of each of the first and second outer electrodes contains Cu, and the recesses are provided in the outermost layer.

13. The electronic component according to claim 12, wherein the outermost layer of each of the first and second outer electrodes includes a plating film.

14. The electronic component according to claim 11, wherein
in a cross section extending along the lengthwise direction and the lamination direction at a center or an approximate center in the width direction of the electronic component:
L1 is defined as a length along the lengthwise direction of the first and second outer electrodes;
L2 is defined as a shortest length along the lengthwise direction of the portion of the recess in which the diameter of the opening of the recess gradually decreases toward the opening side of the recess;
SUM (L2) is defined as a total of L2 lengths of the plurality of recesses; and
SUM (L2)/L1 is no less than about 5% and no more than about 22%.

15. The electronic component according to claim 14, wherein
the first and second outer electrodes are provided on the first principal surface; and
SUM (L2)/L1 is no less than about 5% and no more than about 22% in a portion where the first and second outer electrodes are provided on the first principal surface.

16. An electronic component built-in board comprising:
the electronic component according to claim 11; and
a multilayer printed circuit substrate which includes a resin and in which the electric component is incorporated; wherein
the resin is located in the recesses of the electronic component.

17. The electronic component according to claim 11, wherein
- the first outer electrode extends from the first end surface over to the first and second principal surfaces of the electronic component main body; and
- the second outer electrode extends from the second end surface over to the first and second principal surfaces of the electronic component main body.

18. The electronic component according to claim 11, wherein
- the first outer electrodes is provided on the first principal surface, the second principal surface, the first side surface, and the second side surface of the electronic component main body; and
- the second outer electrode is provided on the first principal surface, the second principal surface, the first side surface, and the second side surface of the electronic component main body.

19. The electronic component according to claim 11, wherein the electronic component is a multilayer ceramic capacitor.

20. The electronic component built-in board according to claim 16, further comprising a via hole electrode or a connection portion of wiring that connects to the first outer electrode or the second outer electrode of the electronic component.

* * * * *